United States Patent
Shimizu et al.

(10) Patent No.: US 10,367,100 B2
(45) Date of Patent: Jul. 30, 2019

(54) SEMICONDUCTOR ELEMENT, SEMICONDUCTOR DEVICE, AND METHOD FOR MANUFACTURING SAME

(71) Applicant: NTT ELECTRONICS CORPORATION, Yokohama-shi, Kanagawa (JP)

(72) Inventors: Makoto Shimizu, Kanagawa (JP); Hiroki Itoh, Kanagawa (JP); Tadao Ishibashi, Kanagawa (JP); Isamu Kotaka, Kanagawa (JP)

(73) Assignee: NTT ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 15/526,473

(22) PCT Filed: Aug. 13, 2015

(86) PCT No.: PCT/JP2015/072937
§ 371 (c)(1),
(2) Date: May 12, 2017

(87) PCT Pub. No.: WO2016/075973
PCT Pub. Date: May 19, 2016

(65) Prior Publication Data
US 2017/0323981 A1 Nov. 9, 2017

(30) Foreign Application Priority Data
Nov. 14, 2014 (JP) .................................. 2014-231806

(51) Int. Cl.
*H01L 29/205* (2006.01)
*H01L 29/861* (2006.01)
(Continued)

(52) U.S. Cl.
CPC ........ *H01L 29/861* (2013.01); *H01L 29/0657* (2013.01); *H01L 29/205* (2013.01);
(Continued)

(58) Field of Classification Search
CPC ..... H01L 29/861; H01L 29/205; H01L 29/66; H01Q 23/00
See application file for complete search history.

(56) References Cited

U.S. PATENT DOCUMENTS

2012/0313105 A1    12/2012    Sawdai et al.

FOREIGN PATENT DOCUMENTS

| JP | 2000-164891 A | 6/2000 |
| JP | 2014-519711 A | 8/2014 |
| WO | 2013/158986 A2 | 10/2013 |

OTHER PUBLICATIONS

Japanese Office Action dated May 8, 2018 from corresponding Japanese Patent Application No. 2014-231806, 5 pages, partial English translation.
(Continued)

*Primary Examiner* — Matthew C Landau
*Assistant Examiner* — Dmitriy Yemelyanov
(74) *Attorney, Agent, or Firm* — Ohlandt, Greeley, Ruggiero & Perle, L.L.P.

(57) ABSTRACT

A semiconductor element capable of adjusting a barrier height $\phi_{Bn}$ and performing zero-bias operation and impedance matching with an antenna for improving detection sensitivity of high-frequency RF electric signals, a method of manufacturing the same, and a semiconductor device having the same. In the semiconductor element, a concentration of InGaAs (n-type InGaAs layer) is intentionally set to be high over a range for preventing the "change of the barrier height caused by the bias" described above up to a deep degeneration range. An electron Fermi level ($E_F$) increases from a band edge of InGaAs (n-type InGaAs layer) to a band edge of InP (InP depletion layer).

3 Claims, 12 Drawing Sheets

(51) Int. Cl.
*H01Q 23/00* (2006.01)
*H01L 29/66* (2006.01)
*H01L 29/36* (2006.01)
*H01L 29/06* (2006.01)

(52) U.S. Cl.
CPC ........ *H01L 29/36* (2013.01); *H01L 29/66121* (2013.01); *H01Q 23/00* (2013.01)

(56) References Cited

OTHER PUBLICATIONS

D. Schoeherr et al., "Extremely Broadband Characterization of a Schottky Diode Based THz Detector", IEEE, IRMMW-2010, pp. 1-2, 2010.
S. R. Forrest et al, "An n-In0.53Ga0.47As/n-InP Rectifiers", J. Appl. Phys., vol. 52, pp. 5838-5842, Sep. 9, 1981.
E.R. Brown et al., "Advances in Schottky Rectifier Performance", IEEE Microwave Magazine, Jun. 2007, pp. 54-59.
N. Kashio et al., "High-Speed and High-Reliability InP-Based HBTs With a Novel Emitter", IEEE Trans. Elec. Dev., vol. 57, No. 2, pp. 373-379, 2010.
International Search Report dated Nov. 10, 2015 from corresponding International PCT Application No. PCT/ JP2015/072937, 2 pages.
International Preliminary Report on Patentability for PCT/JP2015/072937, dated May 16, 2017, 10 pages.
Kleinsasser A. W. et al, "n<+> InGaAs/nGaAs heterojunction Schottky diodes with low barriers controlled by band offset and doping level", Journal of Vacuum Science & Technology, B: Microelectronicsprocessing and phenomena, American Vacuum Society, New York, NY, US, vol. 3, No. 4, Jul. 1, 1985, pp. 1274-1279.
Kleinsasser A. W. et al, "Controlled low barrier height n<+>-InGaAs/n-GaAs pseudomorphic heterojunction Schottky diodes", Applied Physics Letters, AIP Publishing LLC, US, vol. 46, No. 12, Jun. 1, 1985, pp. 1168-1170.
Jwo S. C. et al., "Amorphous Silicon/Silicon Carbide Heterojunction Bulk Unipolar Diodes (HEBUD)". IEEE Electron Device Letters, IEEE Service Center, New York, NY, US, vol. 7, No. 12, Dec. 1, 1986, pp. 689-691.
Prost et al., "InP-Based Unipolar Heterostructure Diode for Vertical Integration, Level Shifting, and Small Signal Rectification", IEICE Transactions on Electronics, Institute of Electronics, Tokyo, JP, vol. E93C, No. 8, Aug. 1, 2010, pp. 1309-1314.
Ito et al., "Broadband and high-sensitivity terahertz-wave detection using Fermi-level managed barrier diode", SPIE Defense and Security Symposium, Mar. 16-20, 2008, Orlando, Florida, United States, SPIE, US, vol. 9856, Apr. 29, 2016, pp. 98560S-1-98560S-8.
Extended European Search Report dated June Jun. 21, 2018 from corresponding European Patent Application No. 15858977.0, 10 pages.

A
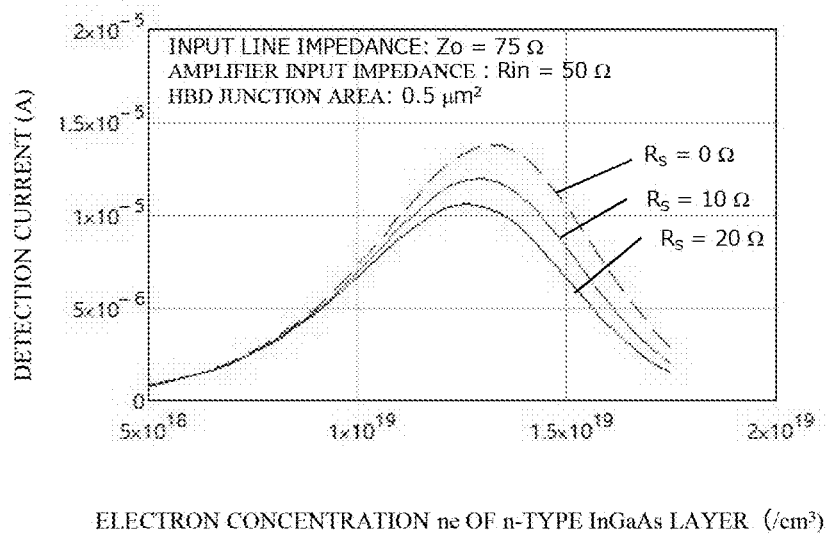
ELECTRON CONCENTRATION $n_e$ OF n-TYPE InGaAs LAYER (/cm³)
B
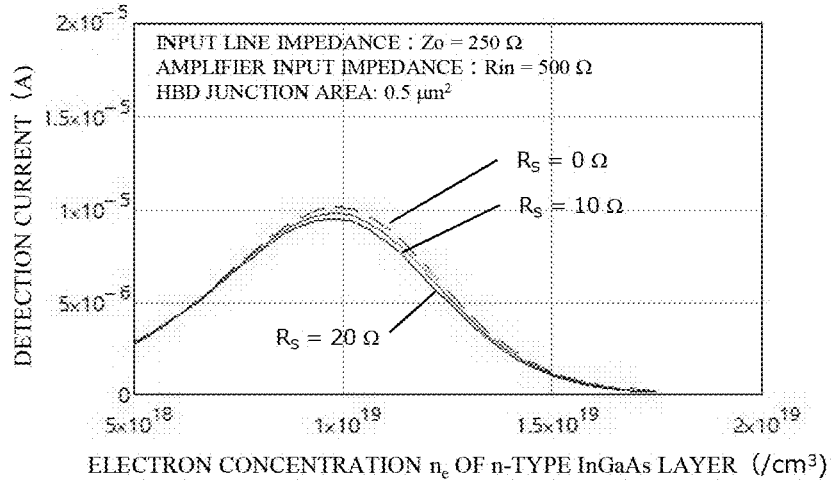
ELECTRON CONCENTRATION $n_e$ OF n-TYPE InGaAs LAYER (/cm³)
FIG. 8

SEMICONDUCTOR ELEMENT, SEMICONDUCTOR DEVICE, AND METHOD FOR MANUFACTURING SAME

BACKGROUND

1. Field of the Disclosure

The present disclosure relates to a semiconductor element formed by stacking a plurality of semiconductor layers, a method of manufacturing the same, and a semiconductor device having the same.

2. Discussion of the Background Art

In various wireless systems that use frequency bands from millimeter waves to terahertz (THz) waves, a nonlinear device is employed as a means for detecting a signal included in a radio frequency (RF) carrier. The Schottky barrier diode (SBD) is typical one of such devices and serves as a mixing device based on envelope detection and varactor operation. Here, a background of the envelope detection is described.

The current-voltage (I-V) characteristic of the SBD can be expressed as Equation 1:

[Equation 1]

$$I_{SBD}(V) \approx I_S \cdot (\exp(V/V_T) - 1) \quad (1)$$

where "$I_S$" denotes a saturation current.

"$V_T$" denotes a thermal voltage (=kT/q: "k" denotes the Boltzmann constant, "T" denotes an absolute temperature, and "q" denotes an electron charge) set to 25 mV at the room temperature.

Using the nonlinearity of this I-V characteristic, a detection output (=average current) may be generated in an RF electric signal input by virtue of a voltage $V_{RF}$ induced in the SBD terminal.

FIG. 11 is an equivalent circuit of a diode. FIG. 12 is a diagram schematically illustrating a current-voltage (I-V) characteristic of the diode and a detection I-V characteristic for a high frequency input. A curve of the detection I-V characteristic is obtained by shifting the I-V characteristic with no input of the high frequency signal to the negative voltage side. The operating point P on the curve of the detection I-V characteristic is determined depending on a load resistance of the detection output circuit.

For a small signal input, a real part of the impedance of the SBD (=differential resistance value) is a derivative of the voltage of the I-V characteristic with no input of the high frequency signal input and can be expressed as follows.

[Equation 2]

$$R_D(V) = \frac{dV}{dI_{SBD}} = \frac{V_T}{I_S \cdot \exp(V/V_T)} \quad (2)$$

According to a general theory of the square law detection, impedance matching is established between the input line and the differential resistance $R_D$ by neglecting a series resistance $R_s$ and a junction capacitance $C_j$, that is, when power is coupled with 100%, a detection current sensitivity against the input power $P_{RF}$ becomes "$1/V_T$ (A/W)" even when the differential resistance $R_D$ changes. Therefore, the detection current sensitivity is maintained constantly regardless of the saturation current $I_S$.

A voltage sensitivity (=open output condition) is set to "$1/I_S$ (V/W)" under the impedance matching state. The smaller saturation current $I_S$ produces the higher voltage sensitivity. If a modulation signal has a low rate, this detection voltage is measured in many cases. Therefore, the voltage sensitivity (V/W) is typically used as sensitivity performance of the SBD.

Meanwhile, if a signal modulation rate is high, the output is amplified using a feedback amplifier having a relatively small input resistance so that the detection current sensitivity is more important. As a typical detection operation, a case where an RF signal is directly input from a coaxial line or a waveguide line to the SBD of zero voltage operation is considered, below. As far as the SBD of the prior art is used, A characteristic impedance Z0input of the input line is much smaller than the diode differential resistance $R_D$ (Z0input<<$R_D$). That is, the matching condition is not satisfied, and the RF signal to the SBD is almost reflected, so that power coupling becomes unsatisfactory. The detection current sensitivity in this impedance mismatching state decreases from the value ($1/V_T$) of the impedance matching to the following value.

$$2(Z0input/R_D)V_T^{-1} = 2(Z0input \times I_S)V_T^{-2}$$

In this case, it is necessary to increase the saturation current $I_S$, in other words, to increase an output current $I_{SBD}$ of the formula (1) to a suitable value. This is similar to a decrease of the differential resistance $R_D$ considering the relationship of the formula (2). For this reason, when using a GaAs-based SBD having a small saturation current $I_S$ in the prior art, the detection circuit is configured with a biased condition (in the formula (2), a condition that the differential resistance $R_D$ is reduced by increasing the voltage V). The matching state can be improved by inserting an impedance-transform circuit between the input line and the SBD. However, this restricts an operating bandwidth. Therefore, a broadband characteristic of the detection device is sacrificed.

Furthermore, when detecting a weak signal, it is desirable to perform diode operation at zero bias to suppress influence of power-source noise. It is advantage that a bias circuit is not necessary. In order to obtain excellent sensitivity in the zero bias state, it is necessary to appropriately increase the saturation current $I_S$ in the formula (1). In other words, since "V=0" in Equation 2, "$R_D = V_T/I_S$" in which the differential resistance $R_D$ decreases as $I_S$ increases. However, as long as the SBD is manufactured using GaAs which is the most common compound semiconductor, the saturation current $I_S$ becomes smaller than an optimum value, and the differential resistance $R_D$ becomes much larger than an effective impedance of the input line.

Especially, it is important when a broadband receiver operating at a frequency band of several hundreds of gigahertz (GHz) to several terahertz (THz) is configured. In many cases, the THz receiver is directly connected to a pure resistance antenna having a constant antenna impedance Zo. Therefore, it is difficult to incorporate a matching circuit. For example, since the impedance of the pure resistance antenna formed on a semiconductor substrate is at about 75Ω, which is small, it is difficult to satisfy impedance matching. In this condition, the detection current output tends to depend on the saturation current $I_S$. In the case of such a circuit configuration in which the impedance matching is difficult, it is desirable to decrease the differential resistance $R_D$ close to the impedance Zo in order to secure coupling efficiency.

Here, in order to decrease the differential resistance $R_D$, it is necessary to increase the saturation current $I_S$ as apparent from the formula (2). The saturation current $I_S$ is a function of a junction area $S_j$ and a barrier height $\phi_{Bn}$ of the SBD as expressed in Equation 3.

[Equation 3]

$$I_S = S_j \times A^* \cdot T^2 \times \exp(-\phi_{Bn}/V_T) \quad (3)$$

where "$A^*$" denotes the Richardson constant, "k" denotes the Boltzmann constant, and "T" denotes a temperature (K).

When a broadband receiver is configured, it is necessary to decrease the junction area $S_j$ and the junction capacitance $C_j$ of the device in order to secure the frequency characteristic. Therefore, if the barrier height $\phi_{Bn}$ is constant (the same semiconductor material), it is difficult to increase the saturation current $I_S$. As a result, as an operation band required in the receiver increases, the saturation current $I_S$ decreases to be far from a state suitable for the zero-bias operation, then the problem of degrading of the zero-bias operation characteristic occurs.

In order to increase the saturation current $I_S$, there is a way that the barrier height $\phi_{Bn}$ of the SBD is lowered by changing the semiconductor material. For example, as a semiconductor material having a barrier height $\phi_{Bn}$ lower than that of GaAs which is a general semiconductor material, InGaAsP obtained by lattice-matched to InP is known. FIG. 10 schematically illustrates a band diagram of the SBD structure using InGaAsP. A Schottky barrier metal 36 comes into contact with an InGaAsP layer 31 having a low concentration to form an SBD structure. A double-layered (33 and 34) re-type contact layer is connected to a contact electrode 35. Note that the "low concentration" refers to a "state in which a concentration of the donor or the acceptor is sufficiently low so it hardly generates a charge that may induce a significant electric field change in the layer when it is depleted." That is, the low concentration InGaAsP layer 31 has a donor or acceptor concentration lower than that of any other doped layer and can obtain a diode effect even when the corresponding layer is not doped.

Among InGaAsP compounds, InGaAs which the composition of InP becomes zero has the lowest SBD barrier. However, even in InGaAs, the electron barrier $\phi_{Bn}$ is set to approximately 0.2 to 0.25 V. In addition, as the operation frequency increases, the required junction area $S_j$ is reduced. Finally, in the case of the SBD designed for a high frequency operation over several hundreds of gigahertz (GHz), it is difficult to lower the electron barrier $\phi_{Bn}$ so as to obtain a desired saturation current $I_S$. In the example of the report by "Univ. Darmstadt" group, it is reported that the differential resistance of the InGaAs-based SBD manufactured for a THz frequency operation is "$R_D$=4.7 k$\Omega$" at zero voltage (for example, see Non-patent Literature 1). The saturation current $I_S$ computed from this differential resistance $R_D$ is approximately 5 µA. It is recognized that this differential resistance $R_D$ is still much larger than the impedance of the typical pure resistance antenna (approximately 75$\Omega$).

Instead of the SBD consisting of metal and semiconductor, a diode obtained by using a semiconductor heterostructure (heterobarrier diode (HBD)) has been reported (see Non-patent Literature 2). In Non-patent Literature 2, it is discussed that an isotype junction formed of n-type InGaAs and n-type InP has a barrier height $\phi_{Bn}$ of 200 meV that determines the saturation current $I_S$. However, this barrier height $\phi_{Bn}$ is equal to that of the InGaAs-based SBD, and an increase of the saturation current $I_S$ is not anticipated.

A diode having a heterostructure of semimetal and semiconductor having a single-crystal state has been reported as well (see Non-patent Literature 3). This semimetal/semiconductor diode includes a junction between semimetals ErAs and InAlGaAs having a composition $[(In_{0.52}Al_{0.48}As)_x(In_{0.53}Ga_{0.47}As)_{1-x}]$, under the condition of lattice matching to InP], and it is reported that the ErAs/InGaAs junction has a minimum barrier height $\phi_{Bn}$ of 150 meV under the condition of "x=0." However, experimentally, the characteristic of the diode having such a low barrier height $\phi_{Bn}$ is not satisfactory, and a design rule is also unclarified.

As described above, in order to improve performance of the SBD or the semiconductor heterostructure diode capable of zero-bias operation at a frequency band of millimeter waves to several THz waves, it is necessary to increase the current sensitivity and set the differential resistance value $R_D$ of the operating point to an appropriate value. For this purpose, it is necessary to increase the saturation current $I_S$, compared to the existing device. However, since the reported InGaAs-based SBD still has a high barrier height $\phi_{Bn}$, it is difficult to optimize the saturation current $I_S$ and the differential resistance value $R_D$, Even in the diode using an ErAs/InAlGaAs heterostructure having a low barrier height $\phi_{Bn}$ (Non-patent Literature 3), its effect was not achieved.

CITATION LIST

Non-Patent Literatures

Non-patent Literature 1: D. Schoenherr et al., "Extremely Broadband Characterization of a Schottky Diode Based THz Detector", IRMMW-2010, pp. 1-2, 2010.
Non-patent Literature 2: S. R. Forrest and O. K. Kim, "An n-$In_{0.53}Ga_{0.47}As$/n-InP rectifiers", J. Appl. Phys. Vol. 52, pp. 5838-5842, 1981.
Non-patent Literature 3: E. R. Brown et al., "Advances in Schottky Rectifier Performance", IEEE Microwave Magazine, June 2007, pp. 54-59, 2007.
Non-patent Literature 4: N. Kashio et al., "High-Speed and High-Reliability InP-Based HBTs with a Novel Emitter", IEEE Trans. Elec. Dev. Vol. 57, NO. 2, pp. 373-379, 2010.

SUMMARY

As described above, in order to improve performance of the detection device capable of zero-bias operation at a high frequency band, in particular, a terahertz (THz) frequency band, it is necessary to increase the saturation current $I_S$ of the operating point (decrease the differential resistance $R_D$), compared to the existing device. However, using the SBD of the prior art, it is difficult to implement a low barrier height $\phi_{Bn}$ necessary for that purpose. In addition, in the semiconductor heterostructure diode, the barrier height $\phi_{Bn}$ is not sufficiently low, compared to the SBD. Furthermore, a design guideline for this purpose is not clarified. That is, using the semiconductor detection device of the prior art, it is difficult to decrease the Schottky barrier height $\phi_{Bn}$ and achieve the zero-bias operation and the antenna impedance matching for improving the detection sensitivity of the high-frequency band RF electric signal.

In this regard, in order to solve the aforementioned problems, the present disclosure provides a semiconductor element, a method of manufacturing the same, and a semiconductor device having the same, capable of adjusting the barrier height $\phi_{Bn}$, improving the detection current sensitivity of the high-frequency band RF electric signal in the zero-bias operation, and achieving antenna impedance matching.

Solution to Problem

In order to achieve aforementioned object, according to the present disclosure, the barrier height $\phi_{Bn}$ is adjusted by controlling an electron concentration of a semiconductor layer having larger electron affinity out of semiconductor heterojunction layers of the semiconductor element. Note that the semiconductor element refers to a heterobarrier diode (HBD) herein.

Specifically, according to the present disclosure, there is provided a method of manufacturing a semiconductor element provided with a stacked diode structure obtained by stacking a first n-type semiconductor layer, a second semiconductor layer having electron affinity lower than that of the first semiconductor layer, and a third n-type semiconductor layer in this order from an anode side to a cathode side, the first and second semiconductor layers having a heterojunction, wherein a doping concentration of the first semiconductor layer is adjusted such that a detection output current detected by inputting a Predetermined high-frequency signal between an anode and a cathode of the semiconductor element is maximized.

In the band diagram of FIG. 2, the layer 2 corresponds to the first semiconductor layer. As an re-type doping concentration increases, the Fermi level $E_f$ increases. Here, the conduction band discontinuity $\Delta E_C$ with the second semiconductor layer is constant. Therefore, the barrier height energy changes according to Equation 4.

[Equation 4]

$$q\phi_{Bn} = \Delta E_C - (E_f - E_C) \quad (4)$$

Here, the term $(E_f - E_C)$ s a value measured from a conduction band edge of the first semiconductor layer. That is, it is possible to adjust the barrier height $\phi_{Bn}$ depending on a doping concentration.

In the method of manufacturing the semiconductor element according to the present disclosure, when a diode structure is formed by stacking a plurality of semiconductor layers including a heterojunction, an optimum electron concentration is obtained in advance. The optimum electron concentration is an optimum value of the electron concentration of a semiconductor layer (first semiconductor layer) having higher electron affinity among the heterojunction semiconductor layers. As a method of obtaining the optimum electron concentration, an electron concentration by which the detection current is maximized by inputting a predetermined RF signal is obtained. That is, the optimum barrier height $\phi_{Bn}$ is determined using the detection current as an index. Therefore, according to the present disclosure, it is possible to provide a method of manufacturing a semiconductor element, capable of adjusting the barrier height $\phi_{Bn}$, improving the detection current sensitivity of the high-frequency band RF electric signal for the zero-bias operation, and achieving antenna impedance matching.

In addition, a fact that the differential resistance value $R_D$ of the HBD can be adjusted to the level of the antenna impedance by adjusting the heterobarrier height $\phi_{Bn}$ using the electron concentration of the first semiconductor layer has not been known in the art.

According to the present disclosure, there is provided a method of manufacturing a semiconductor element provided with a stacked diode structure obtained by stacking a first n-type semiconductor layer, a second semiconductor layer having electron affinity lower than that of the first semiconductor layer, and a third re-type semiconductor layer in this order from an anode side to a cathode side, so that the first and second semiconductor layers have a heterojunction. In case that the semiconductor element is used as a detection circuit for performing detection by inputting a predetermined high-frequency signal between an anode and a cathode of the semiconductor element an adjustment is made as follows. A doping concentration of the first semiconductor layer is adjusted such that a detection output current is maximized, assuming that a line impedance of a high-frequency signal input side of the detection circuit or a pure resistance antenna impedance, and an input impedance of an amplifier connected to the detection output of the detection circuit are given in advance.

In this manufacturing method, it is preferable that the doping concentration of the first semiconductor layer be adjusted such that the detection current is maximized at a line impedance of the high frequency signal input side or a pure resistance antenna impedance, and at an input impedance of an amplifier connected to the detection output of the detection circuit when the semiconductor element is used in the detection circuit.

According to the present disclosure, there is provided a method of manufacturing a semiconductor element provided with a stacked diode structure obtained by stacking a first n-type semiconductor layer, a second semiconductor layer, and a third n-type semiconductor layer in this order from an anode side to a cathode side, the first and second semiconductor layers having a heterojunction, wherein the first semiconductor layer is formed of InGaAs, the second semiconductor layer is formed of InP, and the first semiconductor layer has an electron concentration $n_e$ (cm$^{-3}$) defined by Equation C1.

[Equation C1]

$$n_e = 1.2 \times 10^{19} - 9.5 \times 10^{18} \times \log(\sqrt{S_j}) \quad (C1)$$

where "$S_j$ (μm$^2$)" denotes an area of the heterojunction.

Equation C1 is described. First, Equation 3 expresses a relationship between three parameters of the saturation current $I_S$, the junction area $S_j$, and the barrier height $\phi_{Bn}$ assuming that the temperature T is constant. Here, the saturation current $I_S$ is uniquely determined on the basis of an optimum detection current condition, and the parameter $\phi_{Bn}$ is obtained when the junction area $S_j$ is given depending on a selected frequency. Here, referring to Equation 3, it is recognized that "log($S_j$)" or "log [sqr.($S_j$)]" has a linear relationship with the barrier height $\phi_{Bn}$.

Meanwhile, in case that a heterostructure of the stacked diode structure has already been decided, referring to Equation 4, the Fermi level $E_f$ is determined by setting the barrier height $\phi_{Bn}$ because "$\Delta E_C$" is constant. In addition, experimentally, a relationship between an increase amount of the Fermi level $E_f$ and the carrier concentration $n_e$ has been measured for several semiconductor materials, and it is known that there is a linear relationship between the Fermi level $E_f$ and the concentration $n_e$ under a certain concentration $n_e$. Finally, it is recognized that "$n_e$" and "log [sqr.($S_j$)]" has a linear relationship.

Therefore, if a relationship between an increase of the Fermi level $E_f$ and the carrier concentration $n_e$ has been known already, it is not necessary to manufacture the semiconductor element having the aforementioned diode structure in practice and obtain an optimum concentration $n_e$ from the "maximum value of the detection current." In the case of InGaAs, if it is estimated that "$(E_f - E_C)/q = 1.2 \times 10^{-20} \times n_e$" on the basis of the data of Non-patent Literature 4, Equation C1 is obtained by applying this relationship to the InP/InGaAs heterojunction and expressing it as specific numerical values. Note that the derivation of Equation C1 is described in [Appendix].

According to the present disclosure, there is provided a semiconductor element provided with a stacked diode structure obtained by stacking a first n-type semiconductor layer, a second semiconductor layer, and a third n-type semiconductor layer in this order from an anode side to a cathode side, the first and second semiconductor layers having a heterojunction, wherein the first semiconductor layer is formed of InGaAs, the second semiconductor layer is formed of InP, and the first semiconductor layer has an electron concentration $n_e$ (cm$^{-3}$) defined by Equation C1, where "$S_j$ (µm$^2$)" denotes an area of the heterojunction.

In the semiconductor element and the method of manufacturing the same according to the present disclosure, when a diode structure is formed by stacking a plurality of semiconductor layers including a heterojunction, an optimum electron concentration of a semiconductor layer (first semiconductor layer) having higher electron affinity out of the heterojunction semiconductor layers is determined on the basis of a design value of the junction area of the heterojunction. Therefore, according to the present disclosure, it is possible to provide a semiconductor element and a method of manufacturing the same, capable of adjusting the barrier height $\phi_{Bn}$, improving the detection current sensitivity of the high-frequency band RF electric signal in zero-bias operation, and achieving antenna impedance matching.

In the semiconductor element according to the present disclosure, the stacked diode structure further has a fourth n-type semiconductor layer stacked in the anode side of the first semiconductor layer, and a fifth n-type semiconductor layer stacked in the cathode side of the third semiconductor layer, and the stacked diode structure is formed such that the fifth semiconductor layer adjoins a semi-insulating semiconductor substrate.

The semiconductor element according to the present disclosure further includes an anode electrode and a cathode electrode, wherein the anode electrode adjoins a side of the fourth semiconductor layer opposite to the second semiconductor layer, the fifth semiconductor layer has an area larger than that of the third semiconductor layer as seen in a stacking direction, and the cathode electrode is placed in the third semiconductor layer side of the fifth semiconductor layer such that the cathode electrode does not come into contact with the third semiconductor layer.

In the semiconductor element according to the present disclosure, the anode electrode has an area larger than that of the fourth semiconductor layer as seen in the stacking direction. As a result, it is possible to facilitate wiring by enlarging the area of the anode electrode.

In the semiconductor element according to the present disclosure, the first semiconductor layer has an area larger than that of the second semiconductor layer as seen in the stacking direction. As a result, it is possible to improve a frequency characteristic by reducing a diode junction capacitance.

According to the present disclosure, there is provided a semiconductor device including: an electric connection line that connects an electric high-frequency input circuit and an electric output circuit; and the semiconductor element, wherein the cathode side is connected to the electric connection line, the anode side is connected to the ground, and a detection signal obtained by detecting an electric high-frequency wave from the electric high-frequency input circuit is output to the electric output circuit.

The semiconductor device has the aforementioned semiconductor element. Therefore, according to the present disclosure, it is possible to provide a semiconductor element and a method of manufacturing the same, capable of adjusting the barrier height $\phi_{Bn}$, improving the detection current sensitivity of the high-frequency band RF electric signal in zero-bias operation, and achieving antenna impedance matching.

In the semiconductor device according to the Present disclosure, the electric high-frequency input circuit may be an antenna.

In the semiconductor device according to the present disclosure, the electric high-frequency input circuit may be a planar antenna formed on the semi-insulating semiconductor substrate.

According to the present disclosure, it is possible to provide a semiconductor element and a method of manufacturing the same, capable of adjusting the barrier height $\phi_{Bn}$, improving the detection current sensitivity of the high-frequency band RF electric signal in zero-bias operation, and achieving antenna impedance matching.

BRIEF DESCRIPTION OF THE DRAWINGS

FIG. 8A is a diagram illustrating a relationship between an electron concentration of a first semiconductor layer of the semiconductor element according to the present disclosure and a detection current output from the semiconductor device according to the present disclosure;

FIG. 8B is a diagram illustrating a relationship between an electron concentration of the first semiconductor layer of the semiconductor element according to the present disclosure and the detection current output from the semiconductor device according to the present disclosure;

DETAILED DESCRIPTION OF THE PREFERRED EMBODIMENT

Figure 1:
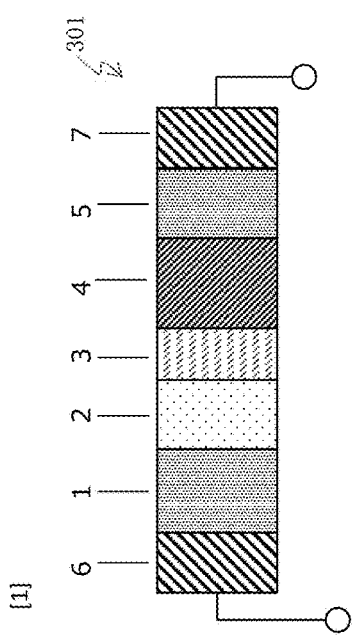
FIG. 1 is a diagram illustrating a structure of a semiconductor element according to the present disclosure.

Embodiments of the present disclosure (?) is now described with reference to the accompanying drawings. The following embodiments are examples of the present disclosure, and the present disclosure is not limited to the embodiments described below. Such examples are just for illustrative purposes, and various changes or modifications may also be possible on the basis of knowledge of a person ordinarily skilled in the art. Note that like reference numerals denote like elements through the entire specification and drawings.

First Embodiment

FIG. 1 is a schematic diagram illustrating a basic configuration of a semiconductor element 301 according to this embodiment. Each semiconductor layer includes the following components.

Figure 2:
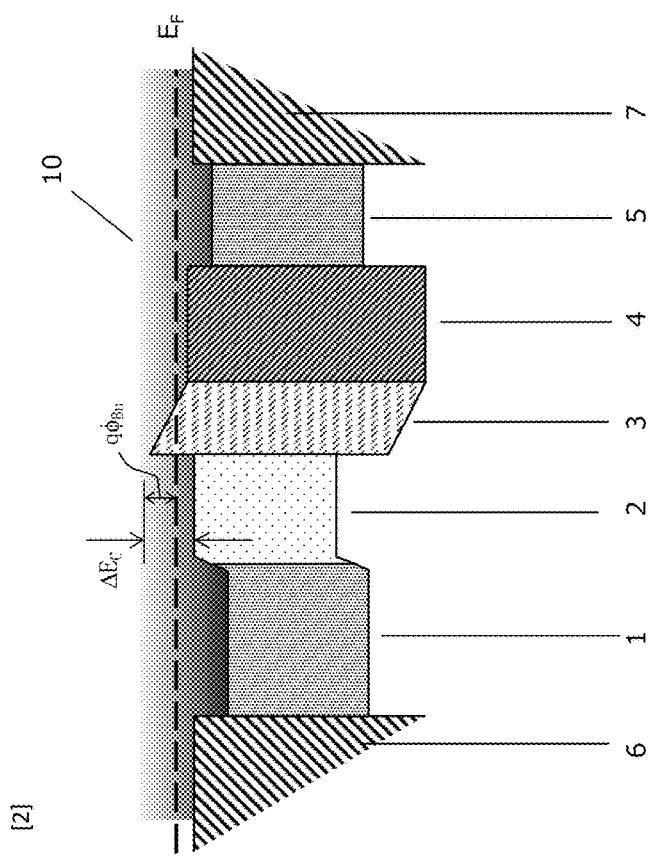
FIG. 2 is a band diagram of a semiconductor element according to the present disclosure.

- 1: high-concentration n-type InGaAs contact layer (fourth semiconductor layer)
- 2: n-type InGaAs layer having an electron concentration adjusted depending on a requirement (first semiconductor layer)
- 3: low-concentration InP depletion layer (second semiconductor layer)
- 4: high-concentration n-type InP layer (third semiconductor layer)
- 5: high-concentration n-type InGaAs contact layer (fifth semiconductor layer)
- 6: anode electrode
- 7: cathode electrode FIG. 2 is a band diagram of the semiconductor element according to this embodiment. The Fermi level $E_F$ and an electron concentration distribution 10 are illustrated in association. Since InGaAs has electron affinity larger than that of InP, a conduction band discontinuity ($\Delta E_C = 240$ meV) is generated on an "in-band line-up" between the n-type InGaAs layer 2 and the low-concentration InP depletion layer 3 as illustrated in FIG. 2. Accordingly, an electron energy barrier ($q\phi_{Bn} = \Delta E_C - (E_f - E_C)$) asymmetric in the InGaAs/InP junction in Equation 4 is generated. The barrier height looking from InP to the InGaAs side depends on a voltage. However, the barrier height looking from InGaAs to the InP side mostly unchanges with a voltage. Using this barrier, it is possible to provide a diode having a rectification characteristic (=nonlinearity).

The electron concentration of InGaAs on the InGaAs/InP interface (n-type InGaAs layer 2) is preferably set to be high in order to reduce a voltage change of the barrier height $\phi_{Bn}$ by virtue of an electron accumulation effect of the heterojunction interface. This is because, if the concentration is low, the barrier height $\phi_{Bn}$ (=$\Delta E_C - E_F$) on the heterojunction interface is changed by the bias due to a change of the charge of the InGaAs side (n-type InGaAs layer 2) to intercept the electric field of the depleted InP (InP depletion layer 3).

A concept of the semiconductor element according to the present disclosure is to intentionally increase the electron concentration of the InGaAs (n-type InGaAs layer 2) up to a deep degeneration range over a range capable of preventing the "change of the barrier height by the bias" described above, such that the electron Fermi level ($E_F$) increases from a band edge of InGaAs (n-type InGaAs layer 2) to a band edge of InP (InP depletion layer 3). In this case, in an ideal case, the I-V characteristic of the HBD can be expressed as follows.

[Equation 5]

$$I_{SBD}(V) = I_S \cdot (\exp(V/V_T) - 1) \quad (5)$$
$$= S_j \times A^* \cdot T^2 \times \exp(-\phi_{Bn}/V_T) \times (\exp(V/V_T) - 1)$$
$$= S_j \times A^* \cdot T^2 \times \exp(-(\Delta E_C - (E_F - E_C))/kT) \times$$
$$(\exp(V/V_T) - 1)$$

That is, the barrier height $\phi_{Bn}$ is adjusted by raising or lowering the Fermi level $E_F$ by changing the electron concentration $n_e$ of the n-type InGaAs layer 2, so that it is possible to change the I-V characteristic of the HBD (change the saturation current $I_S$ and the differential resistance value $R_D$).

One of the methods of experimentally optimizing the electron concentration $n_e$ of the n-type InGaAs layer 2 of the HBD is described below. A first n-type semiconductor layer, a second semiconductor layer having electron affinity lower than that of the first semiconductor layer, and a third n-type semiconductor layer are stacked in this order from the anode side to the cathode side to form a plurality of diode structures having a heterojunction between the first and second semiconductor layers. The electron concentration of the first semiconductor layer in each diode structure is changed by controlling a doping concentration when the first semiconductor layer is stacked. In addition, the detection current obtained by inputting predetermined RF signals to such a diode structure is plotted individually, and the electron concentration capable of obtaining the maximum detection current is found from the result of the plotting.

More specifically, in order to optimize the aforementioned HBD element, assuming that a line impedance of the high frequency signal input side of the detection circuit or a pure resistance antenna impedance, and an input impedance of the amplifier connected to the detection output are given in advance, a doping concentration of the first semiconductor layer is adjusted such that the output current detected by inputting the high frequency signal is maximized. A Plurality of diode structures are prepared by changing the doping concentration as described above, and they are used as the detection circuit, and the line impedance in the high frequency signal input side or the antenna impedance of the pure resistance and the input impedance of the amplifier connected to the detection output are given by using the diode structures. The detection current obtained by inputting predetermined RF signals to the detection circuit is plotted. An electron concentration capable of maximizing the detection current is found from the result of the plotting.

If the detection circuits including the HBD have the same configuration, the optimum saturation current $I_S$ becomes a constant value. Therefore, the barrier height $\phi_{Bn}$ is changed depending on the area $S_j$ of the heterojunction. For this reason, the electron concentration $n_e$ of the n-type InGaAs layer 2 is determined by using Equation C1 as an index assuming that the heterojunction area necessary in the frequency characteristic is denoted by $S_j$ ($\mu m^2$).

It was found that an optimum receive characteristic can be obtained in a wide amplifier input line impedance range of 35 to 200Ω for a typical antenna impedance (75Ω) if the electron concentration $n_e$ of the n-type InGaAs layer 2 is determined in this manner. For example, if the junction area is set to "$S_j = 0.5$ $\mu m^2$," the concentration becomes "$n_e = 1.3 \times 10^{19}$ (/cm$^3$)." In this condition, the Fermi level $E_F$ increases by approximately 160 meV from the conduction band edge. As a result, an effective electron energy barrier $q\phi_{Bn}$ (=$\Delta E_C - E_F$) becomes 80 meV which is remarkably low, and the saturation current $I_S$ becomes 0.17 mA which is remarkably high, compared to the HED of the prior art.

Second Embodiment

The semiconductor element according to this embodiment further has a semi-insulating semiconductor substrate in addition to the semiconductor element 301 of FIG. 1. Specifically, the stacked diode structure is formed such that the fifth semiconductor layer comes into contact with the semi-insulating semiconductor substrate. In addition, the anode electrode adjoins a side of the fourth semiconductor layer opposite to the second semiconductor layer, and the area of the fifth semiconductor layer is larger than the area of the third semiconductor layer as seen in a stacking direction. Furthermore, the cathode electrode is placed in the third semiconductor layer side of the fifth semiconductor layer such that the cathode electrode does not come into contact with the third semiconductor layer.

Figure 3:
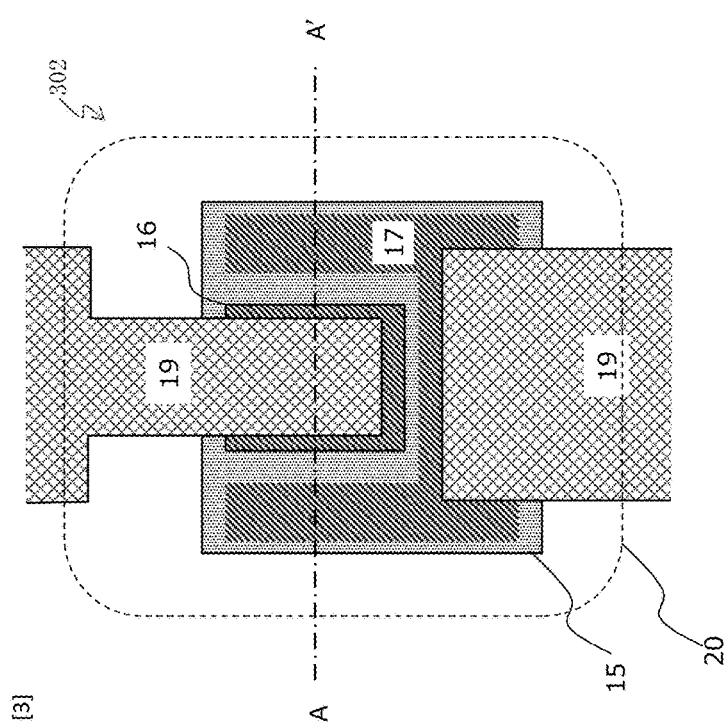
FIG. 3 is a diagram illustrating a structure of the semiconductor element according to the present disclosure.
Figure 4:
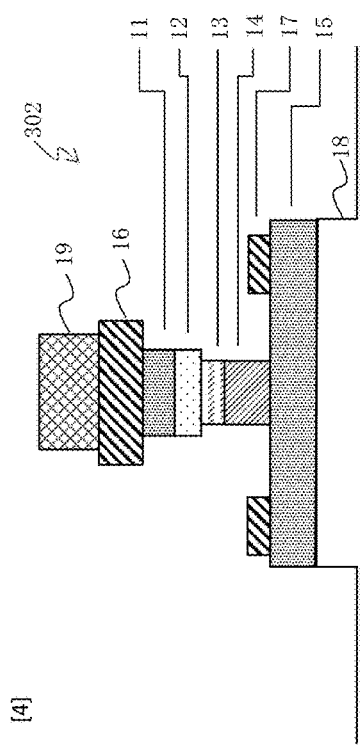
FIG. 4 is a diagram illustrating a structure of the semiconductor element according to the present disclosure.

FIGS. 3 and 4 are schematic diagrams illustrating the semiconductor element 302 according to this embodiment, in which FIG. 3 is a plan view illustrating the semiconductor element, and FIG. 4 is a cross-sectional view (taken along the line A-A'). Each semiconductor layer is formed as follows.

- 11: high-concentration n-type InGaAs contact layer (fourth semiconductor layer)
- 12: n-type InGaAs layer (first semiconductor layer) having an electron concentration adjusted depending on a requirement
- 13: low-concentration InP depletion layer (second semiconductor layer)
- 14: high-concentration n-type InP (third semiconductor layer)
- 15: high-concentration n-type InGaAs contact layer (fifth semiconductor layer)
- 16: anode electrode
- 17: cathode electrode
- 18: semi-insulating semiconductor substrate
- 19: wire metal
- 20: HBD region Reference numerals 11 to 17 correspond to reference numerals 1 to 7 of FIG. 1.

In order to manufacture the HBD, all of the semiconductor layers are epitaxially grown through metal organic vapor phase epitaxy (MO-VPE) or molecular beam epitaxy (MBE), and the resulting patterns are made on substrates. The anode electrode 16 is patterned, and the underlying semiconductor layer is chemically etched by using the patterned anode electrode 16 as a mask, so that an overhang profile shown in the cross-sectional view of FIG. 4 can be manufactured. Since a size of the anode electrode 16 can be formed to be larger than the junction size of the semiconductor layer, it is possible to facilitate patterning of the wire metal 19. Since the low-concentration InP depletion layer 13 and the high-concentration n-type InP 14 are chemically etched by using the n-type InGaAs layer 12 as a mask, the more minute size can be obtained. Therefore, it is possible to reduce the junction capacitance $C_1$ of the HBD.

Third Embodiment

Figure 5:
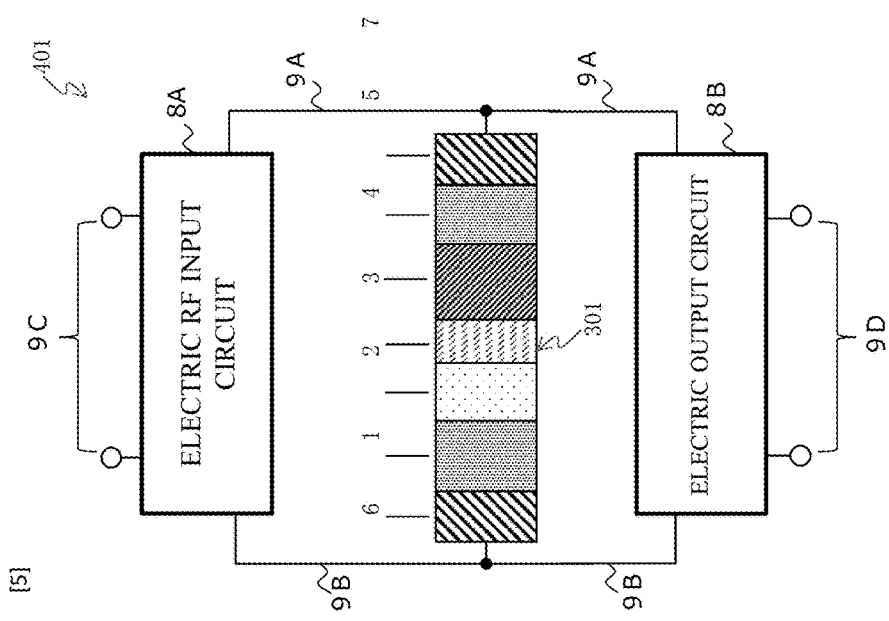
FIG. 5 is a diagram illustrating a semiconductor device (detection circuit) according to the present disclosure.
Figure 6:
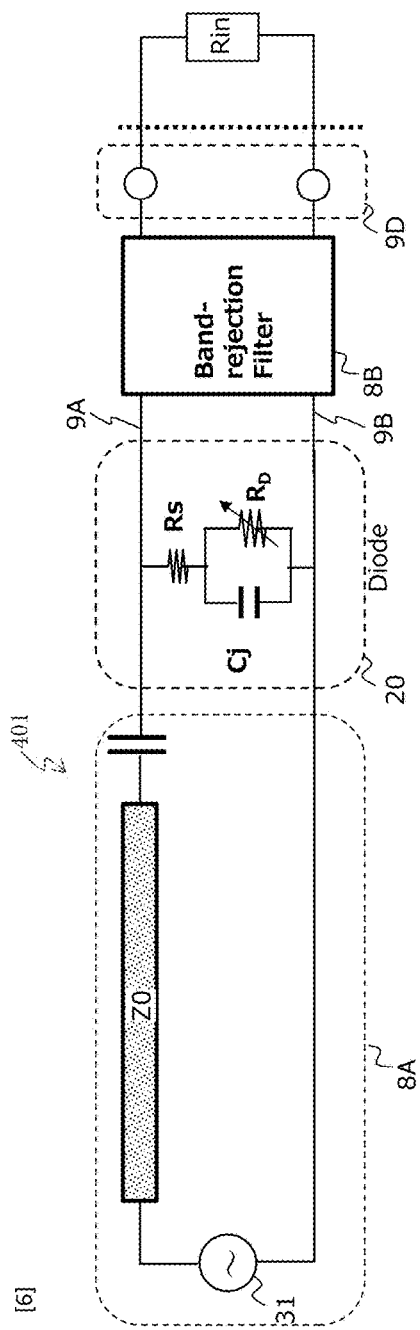
FIG. 6 is a diagram illustrating an equivalent circuit of the semiconductor device (detection circuit) according to the present disclosure.

FIGS. 5 and 6 are diagrams illustrating a semiconductor device 401 according to this embodiment.

The semiconductor device 401 includes an electric connection line 9A that connects an electric high-frequency input circuit 8A and an electric output circuit 8B and the semiconductor element 301 having the cathode side connected to the electric connection line 9A and the anode side connected to the ground 9B to output a detection signal obtained by detecting an electric high frequency wave from the electric high-frequency input circuit 8A to the electric output circuit 8B. Note that, in FIG. 6, the semiconductor element 301 is illustrated as a diode (HBD) 20. Each circuit and the like are formed as follows (those already described in the first embodiment are not described).

- 8A: electric high-frequency (RF) input circuit
- 8B: electric output circuit
- 9A: electric connection line
- 9B: ground
- 9C: RF electric signal input port
- 9D: detection output port The semiconductor device 401 has a pair of electrode terminals between the cathode electrode 7 and the anode electrode 6 of the semiconductor element 301. The electric RF input circuit 8A is connected to one of the electrode terminals, and the electric output circuit 8B is connected to the other electrode terminal, so that they serve as a detection circuit.

The electric RF input circuit 8A is, for example, a transmission line or an antenna. Detection voltage and current generated by an electric RF signal are dominated by the RF voltage applied to a true portion (parallel circuit of $C_j$ and $R_D$) of the HBD (the diode 20 of FIG. 6) and the operation point. Therefore, it is possible to evaluate a detection output characteristic by estimating which kind of the RF voltages will reach both ends of the HBD true portion for an even RF input.

Consider a case where the electric RF input circuit 8A is the pure resistance antenna (impedance Zo=75Ω). If this pure resistance antenna is directly connected to the HBD 20, this can be regarded as an equivalent circuit of FIG. 6. Voltages generated by the differential resistance $R_D$ are obtained for an even RF input 31.

Figure 7:
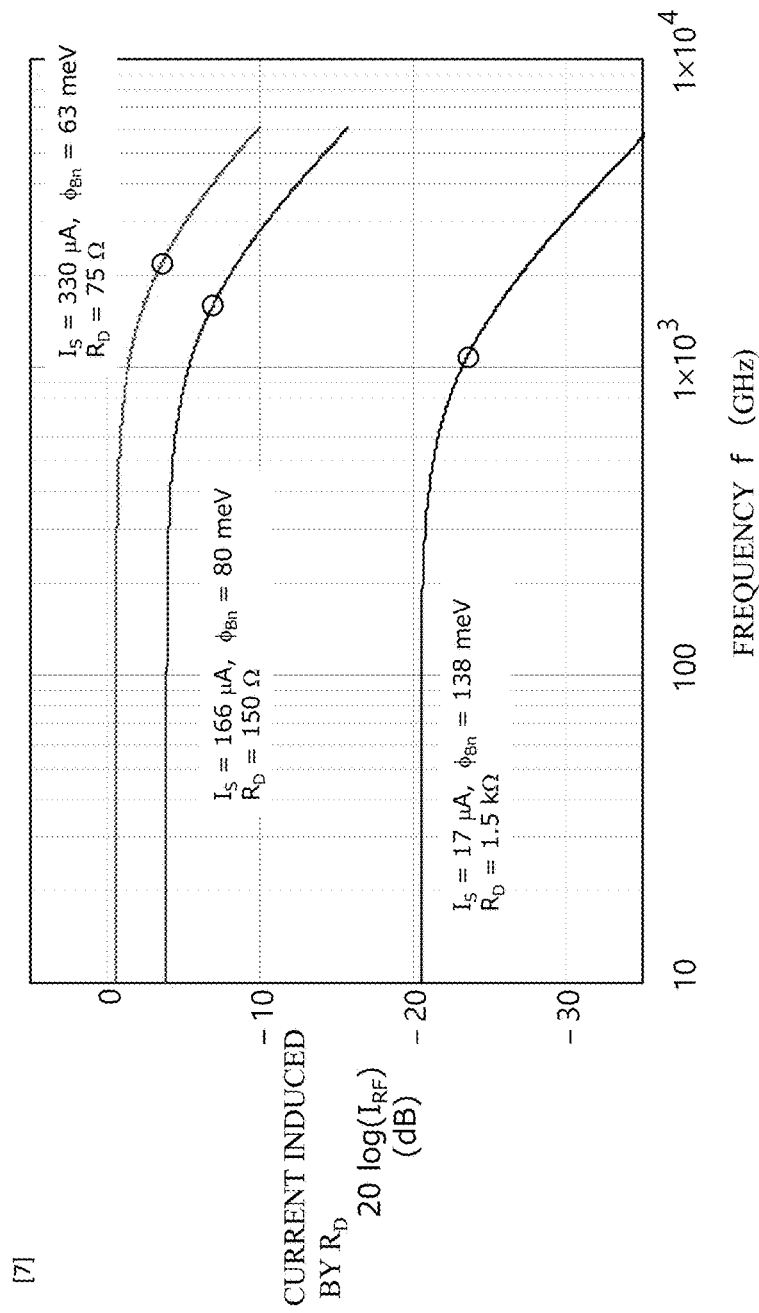
FIG. 7 is a diagram illustrating a barrier height and a frequency characteristic of the semiconductor element according to the present disclosure.

In the circuit of FIG. 6, it is assumed that the impedance of the input line is set to "Zo=75Ω," the junction area is set to "$S_j$=0.5 μm²," the junction capacitance is set to "$C_j$=1.85 fF," the series resistance is set to "$R_S$=10Ω," and the input impedance is set to "$R_{in}$=infinite (the output of the semiconductor device has an open state). The RF current $I_{RF}$ generated in the differential resistance $R_D$ of the HBD 20 depending on a frequency, when the saturation current $I_S$ is changed by inputting even RF power (that is, when the electron concentration of InGaAs is changed), was computed (FIG. 7). In FIG. 7, the abscissa refers to a frequency of the RF input 31, and the ordinate refers to the RF current $I_{RF}$ generated in the differential resistance $R_D$.

If the electron energy barrier is set to "$q\phi_{Bn}$=63 meV," there is a slight voltage drop of the series resistance $R_S$. However, since impedance matching is almost achieved between the differential resistance $R_D$ and the line, the impedance becomes nearly 0 dB in a low frequency range. Meanwhile, as the electron energy barrier increases to "$q\phi_{Bn}$=80 meV" and to "$q\phi_{Bn}$=138 meV," the impedance becomes mismatched to "Zo<$R_D$." Therefore, a current flowing through the differential resistance $R_D$ is reduced, so that the detection current is reduced accordingly. As described above in conjunction with the background art, the current sensitivity is not changed while impedance matching is achieved. That is, if the differential resistance $R_D$ increases and impedance mismatching becomes bigger, they bring to decrease the detection current. Note that the detection current is described below again with reference to FIG. 8.

Under the mismatching conditions, a state shifts from where the bandwidth (frequency characteristic) is determined by "$C_j$·Zo" to where the bandwidth is determined by "$C_j$·$R_D$" as the differential resistance $R_D$ decreases. Therefore, the lower electron energy barrier $q\phi_{Bn}$ is More advantageous. Focusing on a 3 dB-down frequency ($f_{-3\ dB}$), it is recognized that the $f_{-3\ dB}$ of 1.1 THz for the electron energy barrier $q\phi_{Bn}$ of 138 meV increases to 2.2 THz for the electron energy barrier $q\phi_{Bn}$ of 63 meV (in FIG. 7, illustrated as white circles O on each frequency characteristic).

As described above, in many systems that handle high-speed signals in reality, the detection output is connected to a feedback amplifier, and the input impedance $R_{in}$ is typically set to 50Ω. Here, it is important to set a large detection current output in terms of improvement of the signal-to-noise (S/N) ratio.

A behavior of the detection output current can be computed when changing the electron concentration $n_e$ (=electron energy barrier $q\phi_{Bn}$) of the n-type InGaAs layer 2. In FIG. 8A, the impedance of the input line of the circuit of FIG. 6 is set to "Zo=75Ω" and "$R_{in}$=50Ω." In FIG. 8B, the impedance is set to "Zo=250Ω" and "$R_{in}$=500Ω." In FIGS. 8A and 8B, the abscissa refers to the electron concentration $n_e$ of the n-type InGaAs layer 2, and the ordinate refers to the current output to the impedance $R_{in}$ out of the detection current output from the HBD. Note that the RF input 31 is set to "−30 dBm."

The detection current on the ordinate is the current output from the detection circuit having the differential resistance $R_D$ as a power-source impedance to the $R_{in}$ portion. As the electron concentration $n_e$ of the n-type InGaAs layer 2 decreases, and the electron energy barrier $q\phi_{Bn}$ increases, the saturation current $I_S$ decreases. Therefore, the detection current also decreases. Meanwhile, if the electron concentration $n_e$ exceeds its optimum range, the differential resistance $R_D$ decreases relative to the impedance Zo. In this state, the input high-frequency is reflected (that is, the matching state is deteriorated, and the HBD terminal voltage decreases), so that the detection current decreases. For this reason, as illustrated in FIGS. 8A and 8B, the detection current of the $R_{in}$ portion has a peak at a certain electron energy barrier $q\phi_{Bn}$, that is, at a given electron concentration $n_e$ of InGaAs. The series resistance $R_S$ is set to zero (0Ω) or real values (10Ω and 20Ω). A change of an optimum point of the electron concentration $n_e$ caused by the series resistance $R_S$ is not really significant.

In the example of no-feeding (zero bias) operation of FIG. 8A, the optimum value (corresponding to an electron energy barrier $q\phi_{Bn}$ of 80 meV) exists in the vicinity of an electron concentration $n_e$ of $1.3 \times 10^{19}$ (/cm$^3$). Since this electron concentration $n_e$ corresponds to the junction area $S_j$ of 0.5 μm$^2$, the differential resistance $R_D$ becomes 150Ω, and the saturation current $I_S$ becomes 166 μA according to Equation C1. It is recognized that the detection current output has a maximum value if the differential resistance $R_D$ of the HBD is slightly higher than the exact matching impedance (Zo=75Ω) of the input line.

In the example of no-feeding (zero bias) operation of FIG. BB, the optimum value exists in the vicinity of an electron concentration $n_e$ of $1.0 \times 10^{19}$ (/cm$^3$). As in this example, it is important that a certain optimum electron concentration $n_e$ peak exists depending on a given circuit condition, and the electron concentration $n_e$ and the value "log [√$S_j$]" have a linear relationship as estimated from Equation C1. Note that the numerical relationship between the junction area $S_j$ and the optimum electron concentration $n_e$ described above in conjunction with Equation C1 corresponds to a case where the impedance of the input line is set to "Zo=75Ω," and the input impedance of the amplifier is set to "$R_{in}$=50Ω" (a receiver detection circuit of a high-speed signal).

Fourth Embodiment

Figure 9:
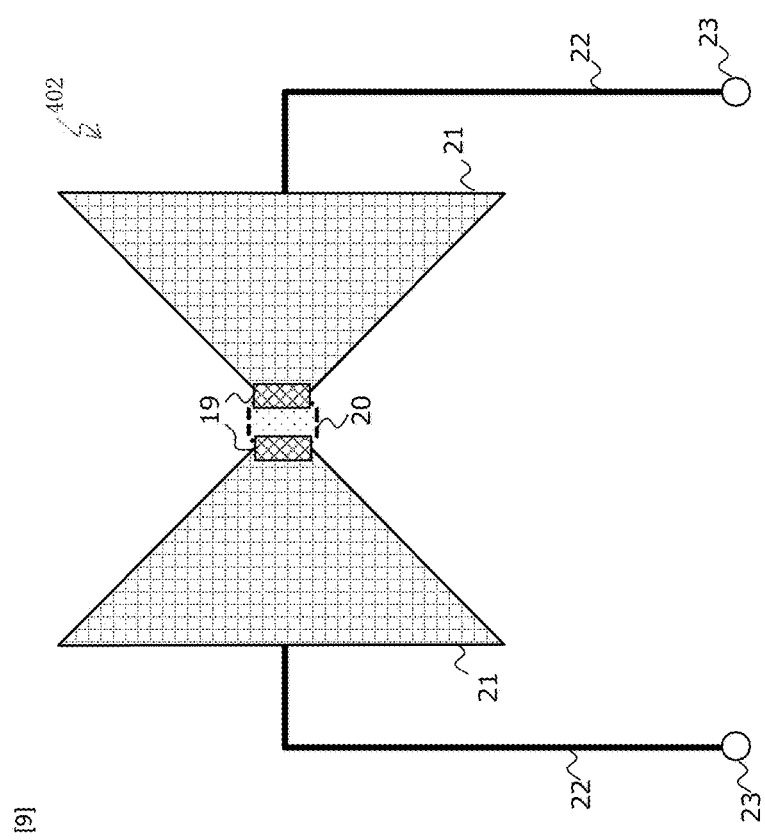
FIG. 9 is a diagram illustrating a semiconductor device (detection circuit) according to the present disclosure.
Figure 10:
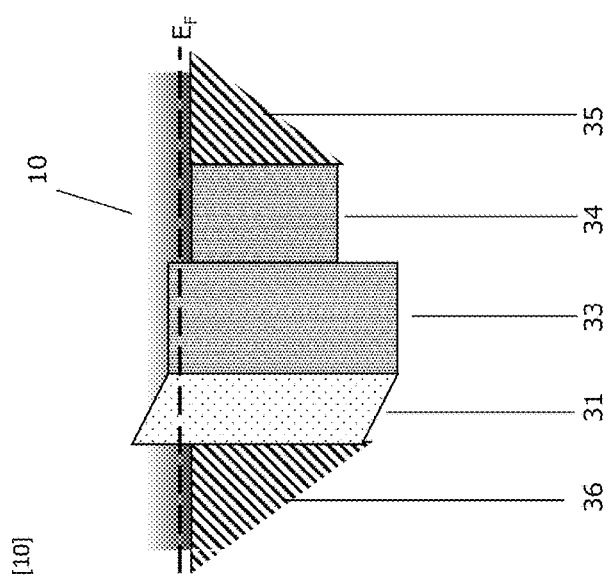
FIG. 10 is a band diagram of a heterobarrier diode (HBD) structure using InGaAsP.
Figure 11:
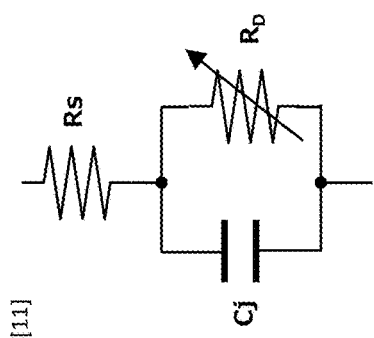
FIG. 11 is a diagram illustrating a diode equivalent circuit.
Figure 12:
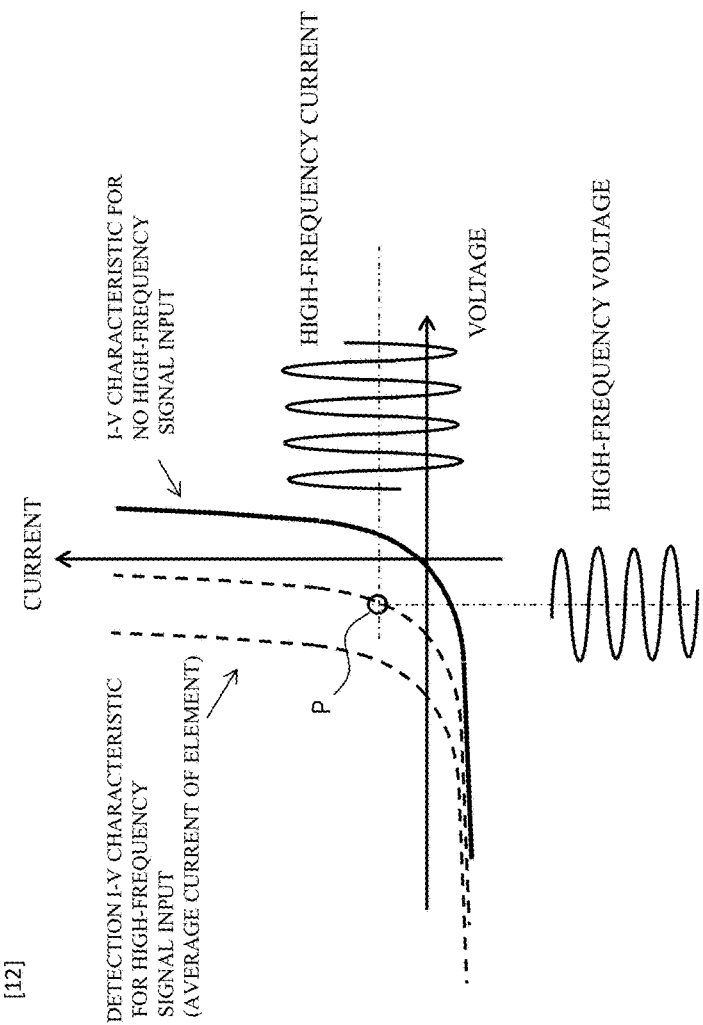
FIG. 12 is a diagram schematically illustrating a current-voltage (I-V) characteristic of a diode and a detection I-V characteristic for a high frequency input.

FIG. 9 is a diagram illustrating a semiconductor device 402 according to this embodiment. A planar bow tie antenna as the electric RF input circuit 8B is connected to the semiconductor device. Each circuit is provided as follows.

19: wire metal
20: HBD region
21: bow tie antenna metal
22: detection output line (one for the electric connection line, and the other for the ground)
23: connection end The HBD region 20 according to this embodiment is the HBD region 20 of FIG. 3.

A pattern end of the bow tie antenna metal 21 is connected to the wire metal 19 extending from the HBD region 20 of FIG. 9. In addition, if a circuit is provided in a transmission line, typically, a high impedance filter circuit capable of removing a high frequency component is connected to the connection end 23. The high frequency signal input to the bow tie antenna may also contain a component emitted back from the corresponding antenna. However, the high frequency signal is less coupled to the detection output line 22 connected to the high impedance filter circuit. That is, as seen from the antenna side which is the electric RF input circuit 8A, the detection output line 22 connected to the electric output circuit 8B has a high-frequency cut-off state.

Meanwhile, if the antenna side is seen from the connection end 23, the frequency of the connection end 23 is deviated from the frequency band of the bow tie antenna. Therefore, it has a low-frequency cut-off state.

Therefore, the semiconductor device 402 basically has the same circuit configuration as that of the equivalent circuit of FIG. 6 (including the electric RF input circuit 8A and the HBD region 20).

<Effects>

As described above, the present disclosure provides a technology capable of improving the detection current output and the bandwidth (3 dB-down frequency) performance of the detection device in which a zero-bias operation is performed at a high frequency band, in particularly, at a THz frequency range. This technology is a design method for basically approximating the differential resistance value $R_D$ of the operating point to an impedance matching state of the RF input line by implementing the lower barrier height $\phi_{Bn}$ and increasing the saturation current $I_S$, compared to the HBD of the prior art, and setting the detection current output to an optimum value. The diode formed of only semiconductor materials has a problem of unstable characteristics caused by the barrier metal, which is serious in the SBD. The present disclosure is able to solve the problem and facilitates manufacturing of the array sensor that requires a uniform detection output.

APPENDIX

How to derive Equation C1 will be described.
A logarithm "log( )" is applied to both sides of Equation 3.

[Equation A1]

$$\log(e)^{-1} \times \log\left(\frac{I_S}{A^* \cdot T^2}\right) = \log(e)^{-1} \times \log(S_j) - \frac{\phi_{Bn}}{V_T} \quad (A1)$$

$$\log(e)^{-1} \times \log\left(\frac{I_S}{A^* \cdot T^2}\right) - \log(e)^{-1} \times \log(S_j) =$$
$$-\frac{\phi_{Bn}}{V_T} \times \frac{\Delta E_C - (E_f - E_C)}{q} = -\frac{\phi_{Bn}}{V_T} \times \left(\frac{\Delta E_C}{q} - G \times n_e\right)$$

Here, electron concentration dependence of the Fermi level is assumed as the following formula.

[Equation A2]

$$(E_f - E_C)/q = G \times n_e \quad (A2)$$

where "G" denotes a coefficient.

In addition, Equation A2 can be expressed as the following formula by setting the junction area to "$S_j = S_{j\,um} \times 10^{-8}$ (cm$^2$)" and setting the unit to microns.

[Equation A3]

$$n_e = \frac{V_T}{G}\left[\log(e)^{-1} \times \log\left(\frac{I_S}{A^* \cdot T^2}\right)\right] + \frac{\Delta E_C}{qG} + \frac{8V_T}{G\log(e)} - \frac{2V_T}{G\log(e)} \times \log\left(\sqrt{S_{jum}}\right) \quad (A3)$$

In the case of the InGaAs/InP heterojunction, the coefficient G is estimated to "$G=1.21 \times 10^{-20}$" on the basis of the non-patent document examples. In the case of a typical high-speed detection circuit of the present disclosure, an optimum value of the saturation current $I_S$ becomes "$I_S$ (optimum)=166 μA" under the following condition (as described above).

input line impedance: Zo=75 Ω
amplifier input impedance: $R_{in}$=50 Ω

In addition, if "$V_T$=0.025 and $\Delta E_C$=0.24/q" is substituted with Equation A3, the following formula can be obtained.

[Equation A4]

$$n_e = \frac{V_T}{G}\left[\log(e)^{-1} \times \log\left(\frac{I_S}{A^* \cdot T^2}\right)\right] + \frac{\Delta E_C}{qG} + \frac{8V_T}{G\log(e)} - \frac{2V_T}{G\log(e)} \times \log\left(\sqrt{S_{jum}}\right) \quad (A4)$$

$$= 1.18 \times 10^{19} - 9.5 \times 10^{18} \log\left(\sqrt{S_{jun}}\right)$$

Equation A4 corresponds to Equation C1.

ADDITIONAL REMARKS

In the following description, a semiconductor detection device that receives RF electric signals at a frequency band of millimeter waves to several THz waves according to the present disclosure, more specifically, a high-speed semiconductor detection device operated in a zero-bias state with low noise will be described.

The present disclosure relates to a semiconductor detection device that receives RF electric signals at a high frequency band, and provides a means capable of appropriately setting the saturation current $I_S$ and the differential resistance value $R_D$ at the zero-bias operating point using a simple structure even in a small junction capacitance and improving a receive sensitivity of a detection receiver device.

<1>

A semiconductor element comprising: a stacked diode structure provided with a heterojunction including a first n-type semiconductor and a second semiconductor, and a third n-type semiconductor adjoining the second semiconductor to serve as a contact layer; an electrode terminal having an electric contact to the first n-type semiconductor; and an electrode terminal having an electric contact to the third n-type semiconductor, wherein, assuming that a desired value is given for an area ($S_j$ μm$^2$) of the heterojunction including the first re-type semiconductor and the second semiconductor, the structure is determined by adjusting an electron concentration of the first n-type semiconductor in order to maximize the detection current input to the amplifier connected to subsequent stages for a given RF input.

<2>

In the semiconductor element according to Part <1>,
the first n-type semiconductor is formed of InGaAs,
the second semiconductor is formed of InP having a low concentration, and
an electron concentration $n_e$ of the first n-type semiconductor is determined by "$n_e$=1.16×10$^{19}$-9. 5×10×log [√$S_j$]/ cm$^3$" when an area of the heterojunction constituted of the first n-type semiconductor and the second semiconductor "$S_j$ μm$^2$" is given.

<3>

In the semiconductor device according to Parts <1> and <2>, a third n-type contact layer is placed to adjoin an outer side of the first n-type semiconductor of the stacked diode structure, a fourth n-type contact layer is placed to adjoin an outer side of the third re-type semiconductor, and each layer is formed on a substrate.

<4>

In the semiconductor device according to Parts <1>, <2>, and <3>, an electric RF input circuit and a detection output circuit are connected to a pair of electrode terminals as described above.

<5>

In the semiconductor device according to Parts <1>, <2>, <3>, and <4>, the semiconductor device is a planar antenna or a stereoscopic antenna in which an electric RF input circuit is formed on a substrate.

REFERENCE SIGNS LIST 301, 302: semiconductor element (HBD)
401, 402: semiconductor device

What is claimed is:

1. A method of manufacturing a semiconductor element provided with a stacked diode structure, the method comprising,
   stacking a first semiconductor layer, a second semiconductor layer having electron affinity lower than that of the first semiconductor layer, and a third n-type semiconductor layer in consecutive order from an anode side to a cathode side,
   wherein the first semiconductor layer is an n-type semiconductor,
   wherein the first semiconductor layer and the second semiconductor layer have a heterojunction;
   detecting a rectified output current by inputting a predetermined THz frequency range signal between an anode and a cathode of the semiconductor element; and
   adjusting the barrier height $\phi_{Bn}$ generated between the first semiconductor layer and the second semiconductor layer at a level of 10 meV by adjusting a doping concentration of the first semiconductor layer so that the output current is maximized from among a plurality of output currents.

2. The method according to claim 1, further comprising:
   connecting an electric input circuit having a line impedance or a pure resistance antenna impedance and an amplifier having a predetermined input impedance to the semiconductor element while detecting the output current,
   inputting the THz frequency range signal from the electric input circuit to the semiconductor element; and detecting the rectified output current that is output to the amplifier.

3. A method of manufacturing a semiconductor element, the method comprising:

provide a stacked diode structure having, in consecutive order from an anode side to a cathode side, a first semiconductor layer, a second semiconductor layer and a third semiconductor layer, wherein the first semiconductor layer and the second semiconductor layer have a heterojunction, wherein the first semiconductor layer is formed of InGaAs and is an n-type semiconductor;

wherein the second semiconductor layer is formed of InP and has an electron affinity lower than the first semiconductor layer wherein the third semiconductor layer is a n-type semiconductor layer; and adjusting the barrier height $\phi_{Bn}$ generated between the first semiconductor layer and the second semiconductor layer at a level of 10 meV by adjusting a doping concentration by doping the first semiconductor layer so as to have an electron concentration $n_e (\text{cm}^{-3})$ defined by Equation C1:

$$n_e = 1.2 \times 10^{19} - 9.5 \times 10^{18} \times \log(\sqrt{S_j}) \quad \text{(C1)}$$

where "$S_j$ (μm$^2$)" denotes an area of the heterojunction.

\* \* \* \* \*